(12) United States Patent
Ghandour

(10) Patent No.: US 8,329,496 B2
(45) Date of Patent: Dec. 11, 2012

(54) DITHERED SCANNED LASER BEAM FOR SCRIBING SOLAR CELL STRUCTURES

(75) Inventor: Osman Ghandour, Morgan Hill, CA (US)

(73) Assignee: MIASOLE, Santa Clara, CA (US)

(*) Notice: Subject to any disclaimer, the term of this patent is extended or adjusted under 35 U.S.C. 154(b) by 236 days.

(21) Appl. No.: 12/904,944

(22) Filed: Oct. 14, 2010

(65) Prior Publication Data

US 2012/0091105 A1   Apr. 19, 2012

(51) Int. Cl.
*H01L 21/301* (2006.01)

(52) U.S. Cl. ......... 438/68; 438/113; 438/460; 438/462; 438/463; 219/121.69

(58) Field of Classification Search ............ 438/68, 438/113, 460, 462, 463, 940; 257/E21.238; 219/121.62, 121.68, 121.69, 121.83
See application file for complete search history.

(56) References Cited

U.S. PATENT DOCUMENTS

| | | | |
|---|---|---|---|
| 4,994,639 A | | 2/1991 | Dickinson et al. |
| 5,593,901 A | | 1/1997 | Oswald et al. |
| 5,795,815 A | * | 8/1998 | Vokoun et al. ............ 438/462 |
| 6,153,448 A | * | 11/2000 | Takahashi et al. .......... 438/114 |
| 6,341,029 B1 | | 1/2002 | Fillion et al. |
| 6,919,162 B1 | | 7/2005 | Brennen et al. |
| 8,048,706 B1 | * | 11/2011 | Ghandour et al. ........... 438/57 |
| 8,227,287 B2 | * | 7/2012 | Ghandour ................... 438/68 |

OTHER PUBLICATIONS

U.S. Appl. No. 12/904,922, "Ablative Scribing of Solar Cell Structures", Osman Ghandour et al., filed Oct. 14, 2010.
U.S. Appl. No. 12/904,958, "Partially Transmitted Imaged Laser Beam for Scribing Solar Cell Structures", Osman Ghandour, filed Oct. 14, 2010.
Jacobs, Geoff, "Understanding Spot Size for Laser Scanning", Professional Surveyor Magazine, Oct. 2006, 2 pages.
Patel, Rajesh, et al., "Why Pulse Duration Matters in Photovoltaics: Short Pulses for More Robust, Higher Quality Laser Scribes," Photovoltaics, No. 1, Jan. 2010, pp. 21-24.
Gordillo, G., et al., "Optical and Structural Characterization of $CuInSe_2$ (CIS) Thin Films Grown by Means of Process in Two Stages", Superficies y Vacio, Jun. 2003, vol. 16, No. 2, 5 pages.
Zengir, Bengul, et al., "Optical Absorption in Polyerystalline CdTe Thin Films", Jornal of Arts and Sciences, May 5, 2006, pp. 103-116.

* cited by examiner

*Primary Examiner* — Samuel M Heinrich
(74) *Attorney, Agent, or Firm* — Weaver Austin Villeneuve & Sampson LLP

(57) ABSTRACT

Provided herein are methods of scribing a solar cell structure to create isolated solar cells. The methods involve scanning and high frequency dithering of a laser beam across a solar cell structure such that the beam creates a stepped scribed line profile. In certain embodiments, a structure including an absorber layer sandwich between two contact layers is provided. The scanned dithered laser beam ablates all of these layers on one part of the scribe line while the back contact layer on another part of the scribe line, leaving an exposed back contact layer. The scribe electrically isolates solar cell structures on either side of the scribe line from each other, while providing a contact point to the back contact layer of one of solar cell structure for subsequent cell-cell interconnection.

20 Claims, 10 Drawing Sheets

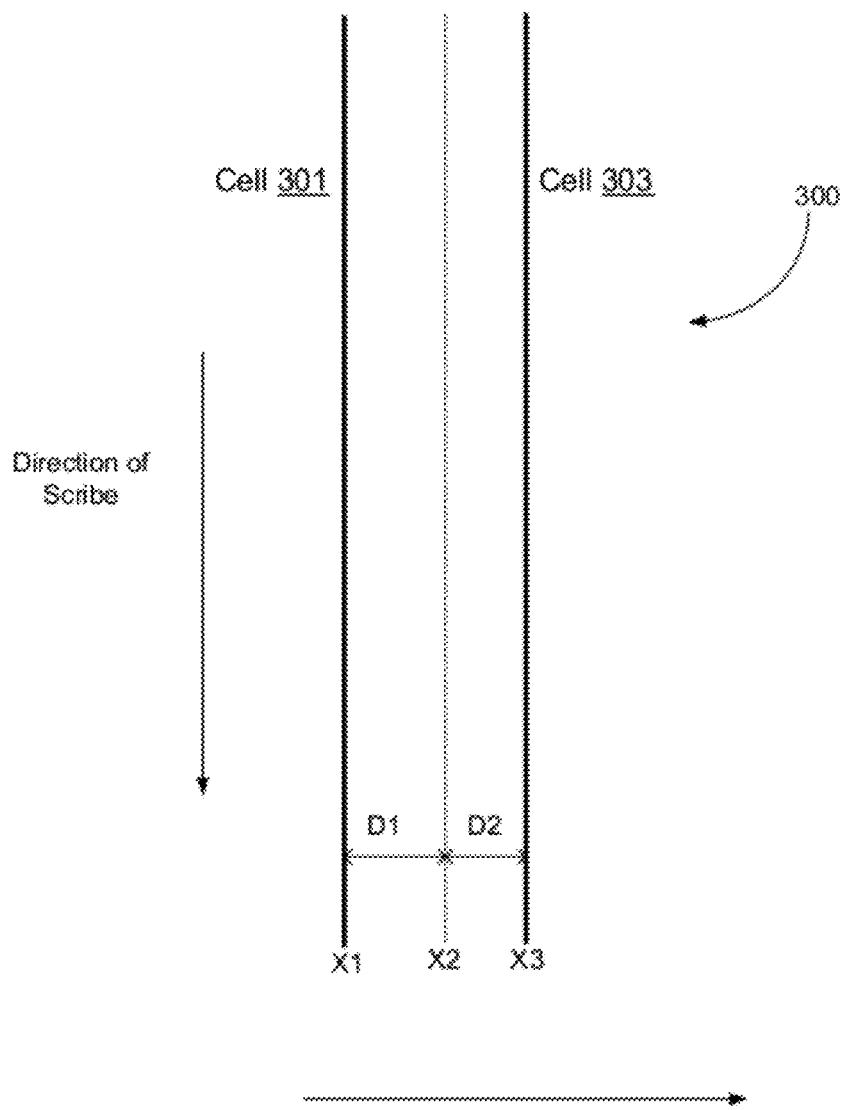
FIG. 3
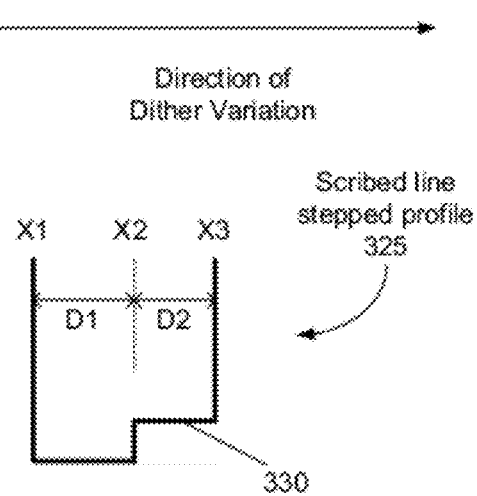

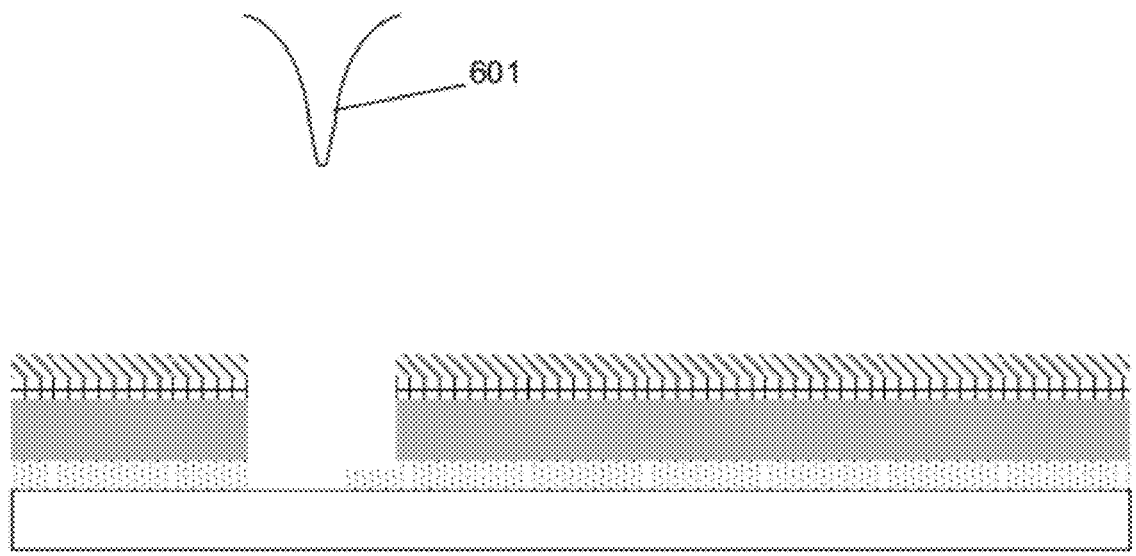
FIG. 6A
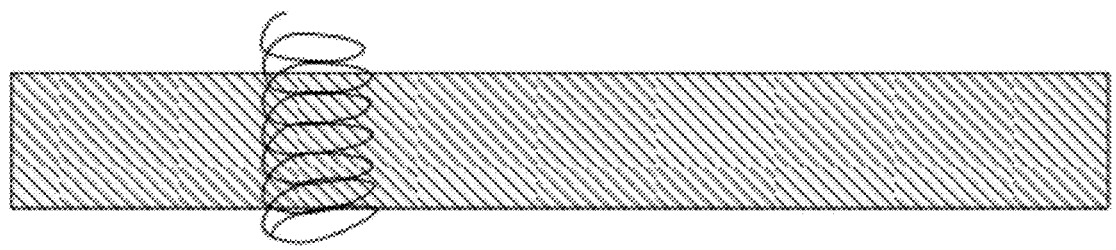
FIG. 6B
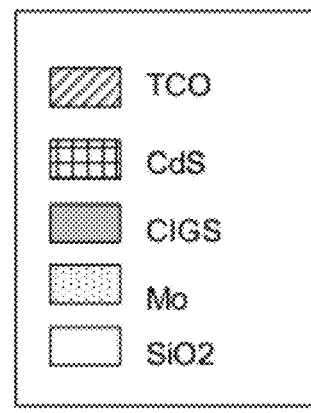

DITHERED SCANNED LASER BEAM FOR SCRIBING SOLAR CELL STRUCTURES

BACKGROUND OF THE INVENTION

Photovoltaic cells are widely used for generation of electricity, with multiple photovoltaic cells interconnected in module assemblies. Such modules may in turn be arranged in arrays and integrated into building structures or otherwise assembled to convert solar energy into electricity by the photovoltaic effect.

Certain photovoltaic cell fabrication processes involve monolithic integration of the cells of a module. For thin film solar modules, this involves depositing thin film materials on a substrate to form a light absorbing layer sandwiched between electrical contact layers. The front or top contact is a transparent and conductive layer for current collection and light enhancement, the light absorbing layer is a semiconductor material, and the back contact is a conductive layer to provide electrical current. In one example of a fabrication process, a metallic back electrical contact layer is deposited on a substrate. A p-type semiconductor layer is then deposited on the back contact electrical contact layer and an n-type semiconductor layer is deposited on the p-type semiconductor layer to complete a p-n junction. Any suitable semiconductor materials, such as CIGS, CIS, CdTe, CdS, ZnS, ZnO, amorphous silicon, polycrystalline silicon, etc. may be used for these layers. A top transparent electrode layer is then deposited on the p-n junction. This layer may be a conductive oxide or other conductive film and is used for current collection. The thin film materials are appropriately scribed with a laser beam to form multiple interconnected cells on the substrate.

SUMMARY OF THE INVENTION

Provided herein are methods of scribing a solar cell structure to create isolated solar cells. The methods involve scanning and high frequency dithering of a laser beam across a solar cell structure such that the beam creates a stepped scribed line profile. In certain embodiments, a structure including an absorber layer sandwich between two contact layers is provided. The scanned dithered laser beam ablates all of these layers on one part of the scribe line while the back contact layer on another part of the scribe line, leaving an exposed back contact layer. The scribe electrically isolates solar cell structures on either side of the scribe line from each other, while providing a contact point to the back contact layer of one of solar cell structure for subsequent cell-cell interconnection.

These and other aspects of the invention are described further below with reference to the figures.

BRIEF DESCRIPTION OF THE DRAWINGS

FIG. 3 is a schematic representation of a scribe line indicating a scribe direction and a dither direction.

FIG. 6A is a schematic illustration of a Guassian beam and a stepped scribed line profile.

FIG. 6B is a top view of a dither path to produce the profile shown in FIG. 6A, according to certain embodiments.

DETAILED DESCRIPTION OF THE PREFERRED EMBODIMENTS

Figure 1A:
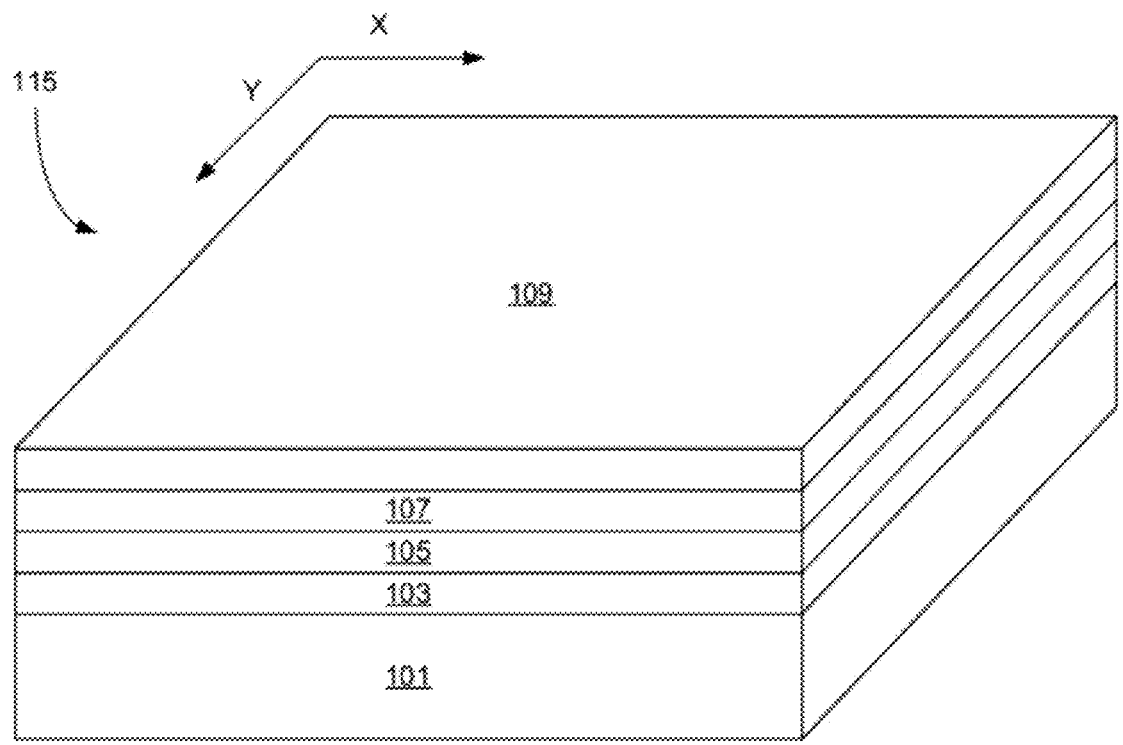
FIG. 1A is a schematic illustration of a substrate having thin film photovoltaic materials deposited thereon according to certain embodiments.

Reference will now be made in detail to specific embodiments of the invention. Examples of the specific embodiments are illustrated in the accompanying drawings. While the invention will be described in conjunction with these specific embodiments, it will be understood that it is not intended to limit the invention to such specific embodiments. On the contrary, it is intended to cover alternatives, modifications, and equivalents as may be included within the spirit and scope of the invention. In the following description, numerous specific details are set forth in order to provide a thorough understanding of the present invention. The present invention may be practiced without some or all of these specific details. In other instances, well known mechanical apparatuses and/or process operations have not been described in detail in order not to unnecessarily obscure the present invention.

Provided herein are methods for laser scribing layers of thin film photovoltaic stacks to produce monolithically integrated modules of interconnected solar cells. The methods involve scanning a laser beam along a scribe line, while dithering the beam in any direction relative to the scribe line. In certain embodiments, the methods involve dithering the beam using piezo systems including position encoders. In certain embodiments, laser operating parameters such as frequency (number of laser pulses per second) or energy per pulse are varied based on the beam position within the scribe line. For example, a laser operating parameter is varied to shape the intensity distribution of the laser beam to thereby produce a stepped scribed line profile. In certain embodiments, dither parameters such as frequency, vibration frequency, amplitude or path are varied based on the beam position within the scribe line. In certain embodiments, a parameter is varied such that front contact-absorber-back contact layers are ablated along one portion of the scribe line, while the back contact layer is left intact along another parallel portion of the scribe line. The result is two electrically unconnected photovoltaic stacks on either side of the scribe line, which can be connected in series (top contact to exposed bottom contact) in subsequent processing.

As used herein, the term "dither" refers to superimposing on a scan motion a higher frequency motion. Laser beam position is moved by small amounts. The frequency of the motion, i.e., the number of moves made per unit time, ranges on the order of hundreds of hertz to tens of kilohertz. In many embodiments, the dither may be characterized as a motion in one or more directions with respect to the scanning motion.

In certain embodiments, the dither is a piezo-driven motion. Dither frequency is the number of moves the piezo makes per unit time. Dither amplitude is a measure of the length scale of the move at the piezo, e.g., ranging from a picometer to a few microns. This amplitude is transferred to a mirror, with the mirror then sending the beam through an optical system. The optical system design parameters (e.g., F-theta focal length) translate this into a motion of the laser spot at the substrate plane with the same frequency as the dither frequency, but with a motion amplitude that is dependent on the focal length. The motion of the laser beam spot is dither-induced motion that comes from dithering of one or more mirrors. The mirror(s) may be dithered by a piezo or other mechanism. As used herein, the term dither is used to refer to the high frequency motion of the mirrors as well as the induced motion of the beam. The latter is also referred to in some instances as dither-induced motion.

According to various embodiments, one or more of a dither parameter and a laser operating parameter are changed at prescribed positions within the scribe line such that a scribed line cross-sectional profile is stepped. In many embodiments, the parameter(s) are varied along a direction orthogonal to the scanning motion, e.g., transverse to the scribe line. In this manner, more material is removed along one side of the scribe line. Dither and/or dither-induced motion parameters that may be varied include frequency of dithering, vibration frequency, amplitude of dithering, direction of the dither motion path, or the path itself. Laser operating parameters that may be varied include pulse repetition rate (also referred to as laser operating frequency), beam amplitude (i.e., energy per pulse), beam intensity, and dwell time. These and other aspects of the invention are described more fully below with reference to FIGS. 1-9.

Solar module fabrication often involves depositing thin films on relatively large area substrates. Individual cells are then produced from the substrates having thin film materials deposited thereon. Laser scribing of thin film photovoltaic layers to form individual cells eliminates the need to mechanically cut the substrate and reconnect the formed cells in series. FIG. 1A shows a perspective view of an example of a substrate 101 supporting thin films 103, 105, 107 and 109 that together form thin film photovoltaic stack 115. For the purposes of illustration, the figure is not to scale; for example, thickness of the substrate may be on the order of mils, the thickness of the thin film stack on the order of microns (or hundredths of mils) with the x- and y-dimensions of the substrate on the order of feet. Substrate 101 provides mechanical support for the thin film materials, and is generally an insulator such as silicon dioxide, glass or other material. In certain embodiments, substrate 101 may include a metal or conductive substrate coated with silicon dioxide layer or other insulator.

Back electrical contact layer 103 provides electrical contact to allow electrical current to flow through the photovoltaic cell, and may be made of any appropriate material, e.g., molybdenum, niobium, copper, silver, aluminum, etc. A p-type semiconductor layer 105 is deposited on back electrical contact layer 103 and an n-type semiconductor layer 107 is deposited on p-type semiconductor layer 105 to complete a p-n junction. According to various embodiments, any suitable semiconductor materials, such as CIGS, CIS, CdTe, CdS, ZnS, ZnO, amorphous silicon, polycrystalline silicon, etc. are used for layers 105 and 107. For example, the p-type semiconductor layer 105 may be CIGS or CIS, and the n-type semiconductor layer 107 may be CdS or a cadmium free material, such as ZnS, ZnO, etc. Layer 105 may also be referred to as an absorber layer, and layer 107 as a buffer layer. Front transparent electrical contact layer 109 is deposited on the p-n junction. In certain embodiments, front transparent electrical contact layer 109 is a transparent conducting oxide (TCO), for example, zinc oxide, aluminum-doped zinc oxide (AZO) and indium tin oxide (ITO). FIG. 1A shows an example of a thin film stack on a substrate; other materials may be used in addition to or instead of any of these materials. In certain embodiments, thin film layers are deposited on a front transparent substrate, with the front electrical contact layer deposited on the transparent substrate, followed by absorber layers and the back electrical contact layer.

Figure 1B:
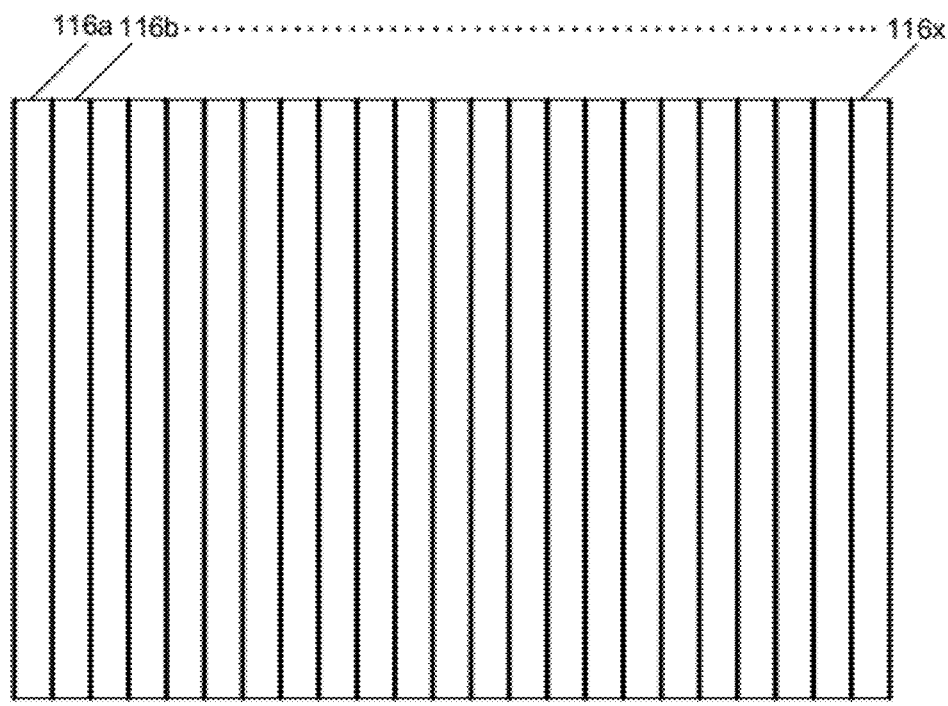
FIG. 1B is a schematic illustration of a top view of a monolithically integrated module.

FIG. 1B shows a top view of cells of monolithically integrated module: instead of a single large area photovoltaic stack, scribe lines are used to create multiple cells 116a, 116b ... 116x, connected in series, with the front electrical contact of each cell connected to the back electrical contact of an adjacent cell (not shown). The inventive methods are typically used to scribe lines from the front, with the laser beam incident on an exposed film.

Figure 2:
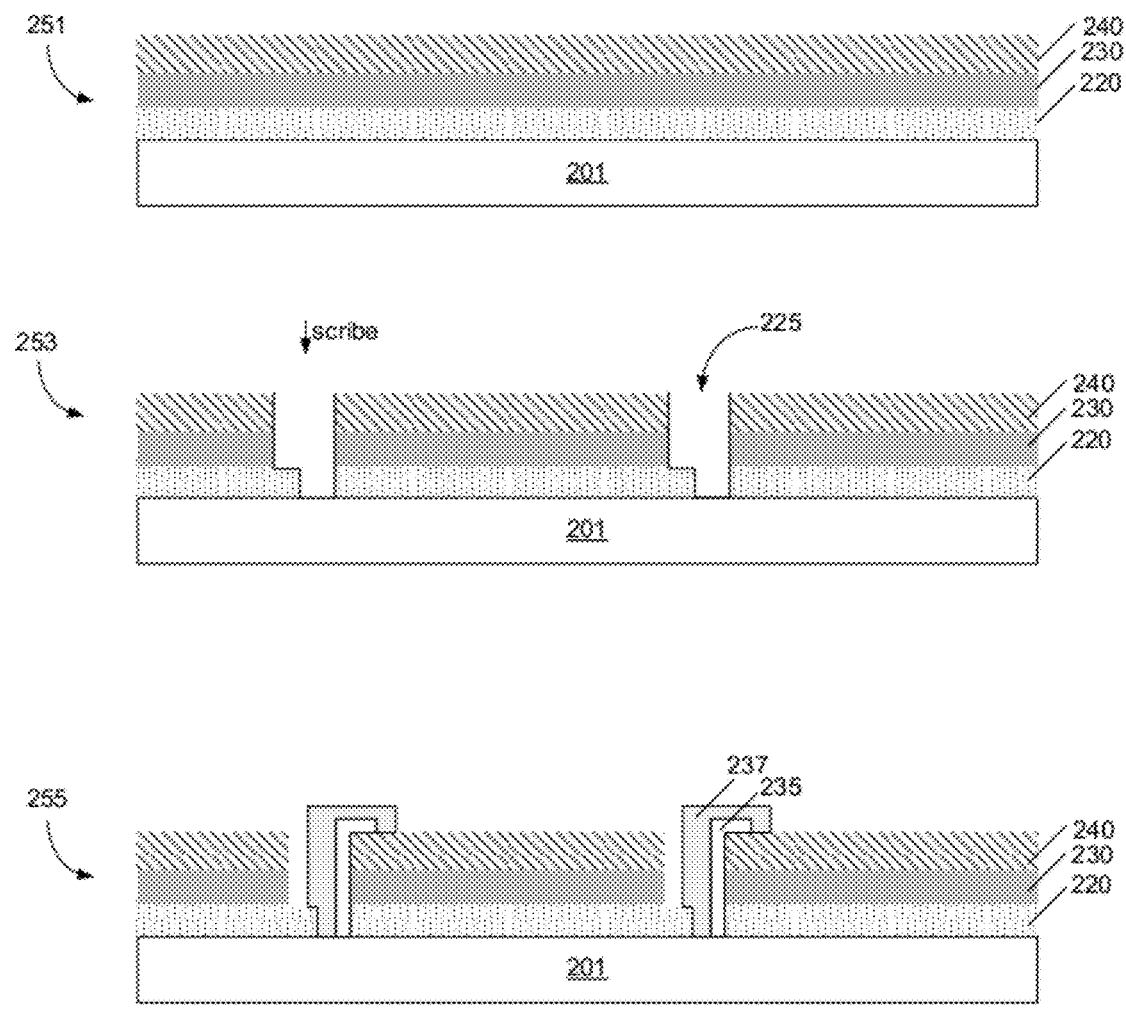
FIG. 2 is a schematic illustration of a solar module at various stages of another monolithic integration process according to various embodiments.

FIG. 2 provides an example of a monolithic integration process employing laser scribing, in which first contact layer 220, absorber/buffer layers 230 and second contact layer 240 are deposited on a substrate 201. In one example, substrate 201 is a silicon oxide coated substrate, first contact layer 220 is a back contact film such as molybdenum and second contact layer 240 is a TCO layer. The as-deposited stack is shown at 251. At 253, stepped scribed line profiles 225 are shown. Methods of laser scribing to produce the stepped profiles are described below. At 255, insulators 235 and conductive interconnects 237 are depicted. In certain embodiments, insulators 235 are cured printed insulator ink and conductive interconnects 237 are cured printed silver ink, though other materials may be employed. The separated cells are now electrically connected in series via the interconnects 237. While FIG. 2 provides an example of an integration process for monolithically integrated solar cells, the inventive scribing processes described below are not limited to these particular processes but may be used with other solar module integration processes that employ laser scribing.

According to various embodiments, the scribed line having a stepped profile is formed in a one or more passes along the scribe line. FIG. 3 shows a schematic of a scribe line 300, in between two cells, cell 301 and cell 303. A scribe direction and a dither variation direction, substantially perpendicular to the scribe direction, are indicated. In certain embodiments, as the laser is scanned along the scribe line, e.g., via a galvo scanner at a scan rate, it is dithered within the scribe line at a certain dither rate. The dither rate is much higher than the scan rate. In certain embodiments, the dither rate is sufficiently high that piezo-controlled scanning is employed to perform the dithering in any direction relative to the scribe. Piezo devices having position encoders are used in certain embodiments to change parameters such as dither-induced motion pattern (frequency, direction, amplitude, etc.) and/or laser operating parameters on the fly at prescribed positions within the scribe line.

Three positions, X1, X2 and X3 are indicated across the scribe line, X1 indicating the boundary between the cell 301 and the scribe line, X3 the boundary between cell 303 and the scribe line and X2 the point in between the edges of the scribe line at which the profile is stepped, e.g., the position to which the back electrode of cell 303 extends. The corresponding cross-sectional profile 325 of the scribed line including step 330 formed by the exposed back electrode of cell 303 is also shown. According to various embodiments, scribe line widths range from about 50-150 micrometers, though the methods may be employed for narrower or wider widths as well. The width of the unstepped portion of the scribe is D1, D1 being the distance between X1 and X2; and the width of stepped portion of the scribe is D2, D2 being the distance between X3 and X2. Examples of these widths are 25-75 micrometers, though other widths may be used as well. D1 and D2 may be approximately the equal or may be different depending on the particular integration scheme.

Figure 4:
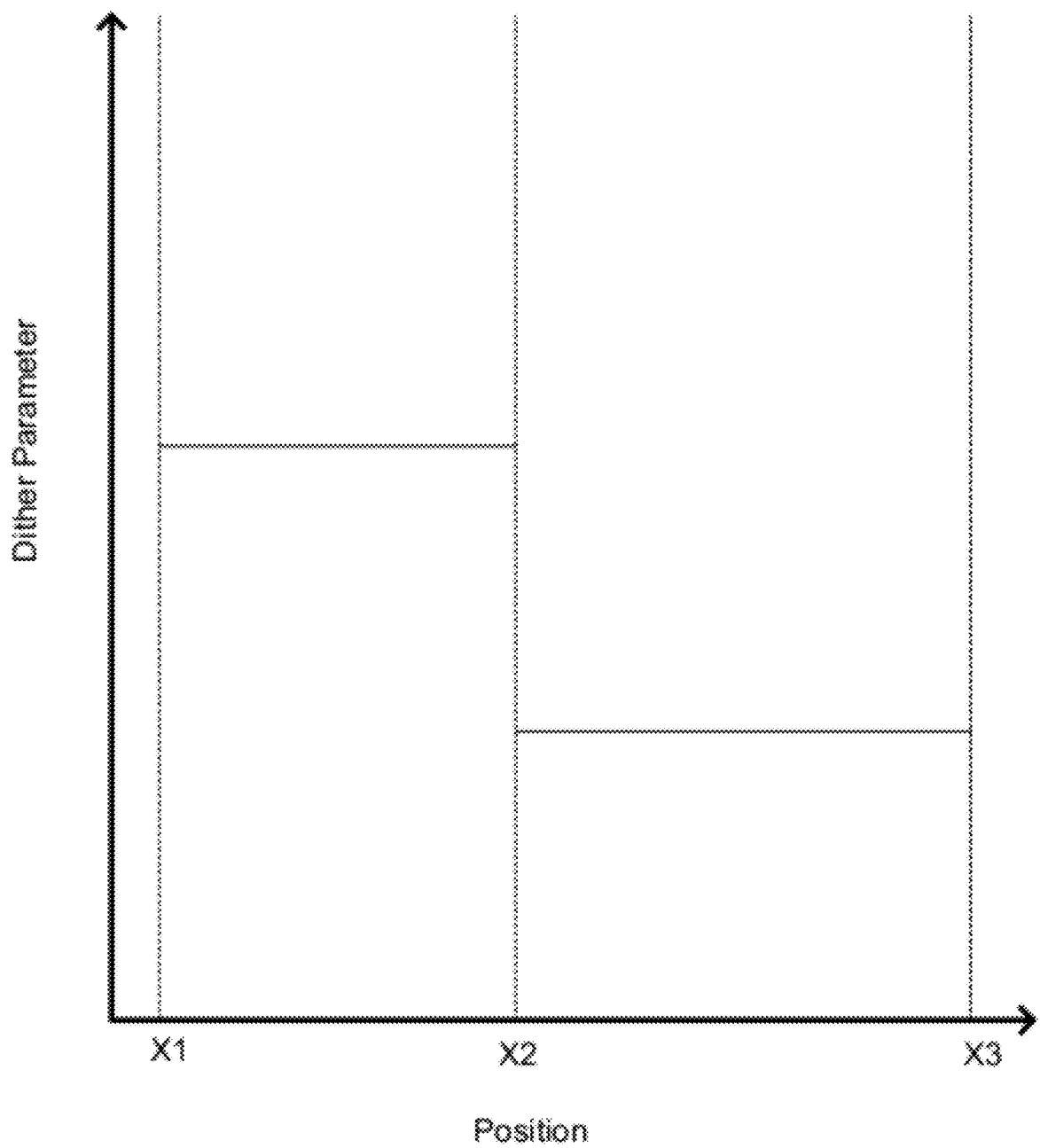
FIG. 4 is a graph representing variation of a dither parameter across a scribe line.

According to various embodiments, to create the stepped profile a dither and/or a laser operating parameter is varied according to position of the laser beam across the scribe line. FIG. 4 provides an example of a step-wise variation of a dither or laser operating parameter; the parameter is higher to increase ablation between positions X1 and X2; and lowered between X2 and X3 to stop at the back contact or other desired layer. In certain embodiments, each pulse has a Gaussian distribution; accordingly position may refer to the position of the laser beam peak. In other embodiments, the laser beam is shaped to have a top-hat intensity distribution profile; position may refer to the length or a midpoint of max intensity. According to various embodiments, a dither parameter is dither frequency, amplitude, direction, or the motion pattern. According to various embodiments, a laser operating parameter is pulse repetition rate, energy per pulse, beam intensity, or dwell time. In certain embodiments, two or more different parameters are employed, e.g., two or more dither parameters, two or more laser operating parameters, or one or more dither parameters and one or more laser operating parameters. While step-wise variation is illustrated, in certain embodiments, the dither and/or laser operating parameter(s) may be varied in other manners to obtain the desired profile. For example, in certain embodiments, a dither and/or laser operating parameter variation is multi-step, linear, or non-linear with respect to position. In certain embodiments, varying a dither and/or laser operating parameter(s) involves employing a piezo feedback control is employed to sense beam position. In certain embodiments, the dither is bi-directional, i.e., a dither path including components along the scribe line as well as across it, is used. An example of this is shown with reference to FIG. 6B, below.

Figure 5:
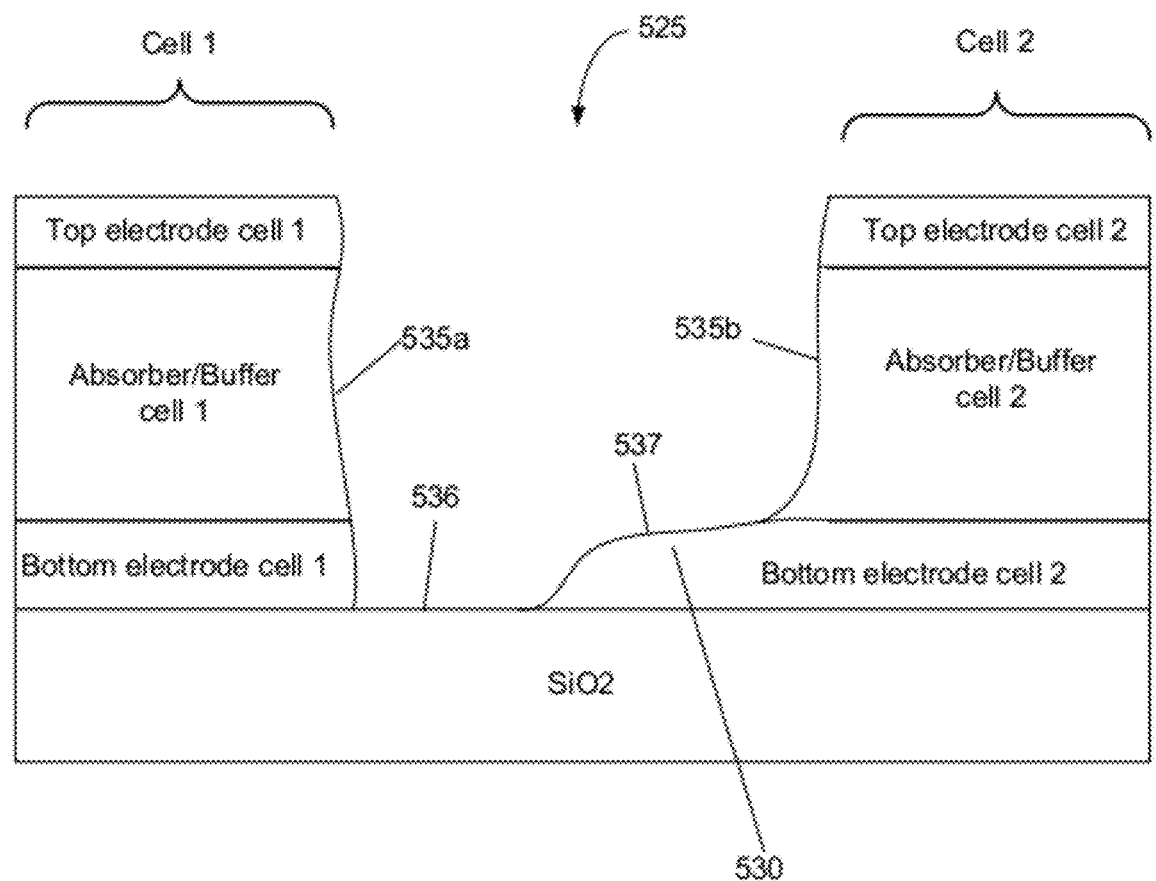
FIG. 5 is a schematic representation of an example of a stepped scribed line profile.

As described above, in certain embodiments, a scribed line profile is stepped, that is there is at least one step in a cross-sectional profile of the scribed line. FIG. 5 shows a profile 525 including a step 530 in between two cells. The profile includes two substantially parallel sidewalls 535a and 535b; 535a including a full photovoltaic stack, including the bottom electrode, absorber and buffer layers and top electrode (TCO) layer of one cell; 535b including the absorber layer, buffer layer, and top electrode (TCO) layer of the adjacent cell. According to various embodiments, sidewall 535b also includes a part of the thickness of the bottom electrode, though this is not necessarily so in all embodiments. The stepped profile includes a bottom surface portion 536 disposed between step 525 and sidewall 535a. This bottom surface portion electrically isolates the solar cells on either side of the scribed line. A portion of the bottom contact of one cell forms the step 530, which extends past sidewall 535b toward sidewall 535a without contacting any part of it, and is characterized by a top surface 537 of exposed bottom contact material.

According to various embodiments, a reduced spot size or beam diameter is used to form the stepped profile. For a Gaussian beam, a Gaussian diameter is the diameter at which its intensity is its maximum intensity/$e^2$, or 13.5% of the maximum intensity. A full width half max-based definition is the beam diameter at which the beam is at half intensity. A Gaussian beam diameter of about 80 microns may be used to create an unstepped scribe profile having a width of a about 100 microns; for a dithered stepped scribe profile, a beam of about 10 microns may be employed. The beam diameter may be determined by the smaller of D1 and D2 described in FIG. 3. For example, the Gaussian beam diameter may range from 10%-80% of the smaller of these widths. In certain embodiments, the Gaussian diameter is no more than about 40% of the full width of the scribe line.

FIG. 6A depicts a Gaussian beam 601 at a particular point along a scribe line, as well as the resulting stepped profile. FIG. 6B shows a top view of the dither path. In the depicted embodiment, the laser beam in controlled to dither both in the X (across the scribe) and Y (along the scribe) to create the dither path. The dither path length (i.e. amplitude) or spatial frequency (the number of lines or cycles per unit length) in the unstepped portion of the scribe line is higher than that in the stepped portion.

A dither rate is significantly higher than a scan rate to create the stepped profile along the length of the scribe line. The dither rate is the dither frequency times the distance between irradiation spot centers across the line, which may be on the order of microns or tens of microns in certain embodiments.

According to various embodiments, a dither frequency of at least about 10 kHz or 20 kHz is used. In a particular example, a dither frequency is 40 kHz. Example scan rates are 0.001 to 3 meters/sec. Depending on the embodiment, one or more passes of the scanned and dithered laser beam along the length of the scribe line may be employed to create the stepped scribed line profile. By scanning a dithered beam, in certain embodiments, it is possible to generate the stepped profile in a single pass, though in other embodiments, an optimized scribe may involve multiple passes of the scanned and dithered beam.

Figure 7:
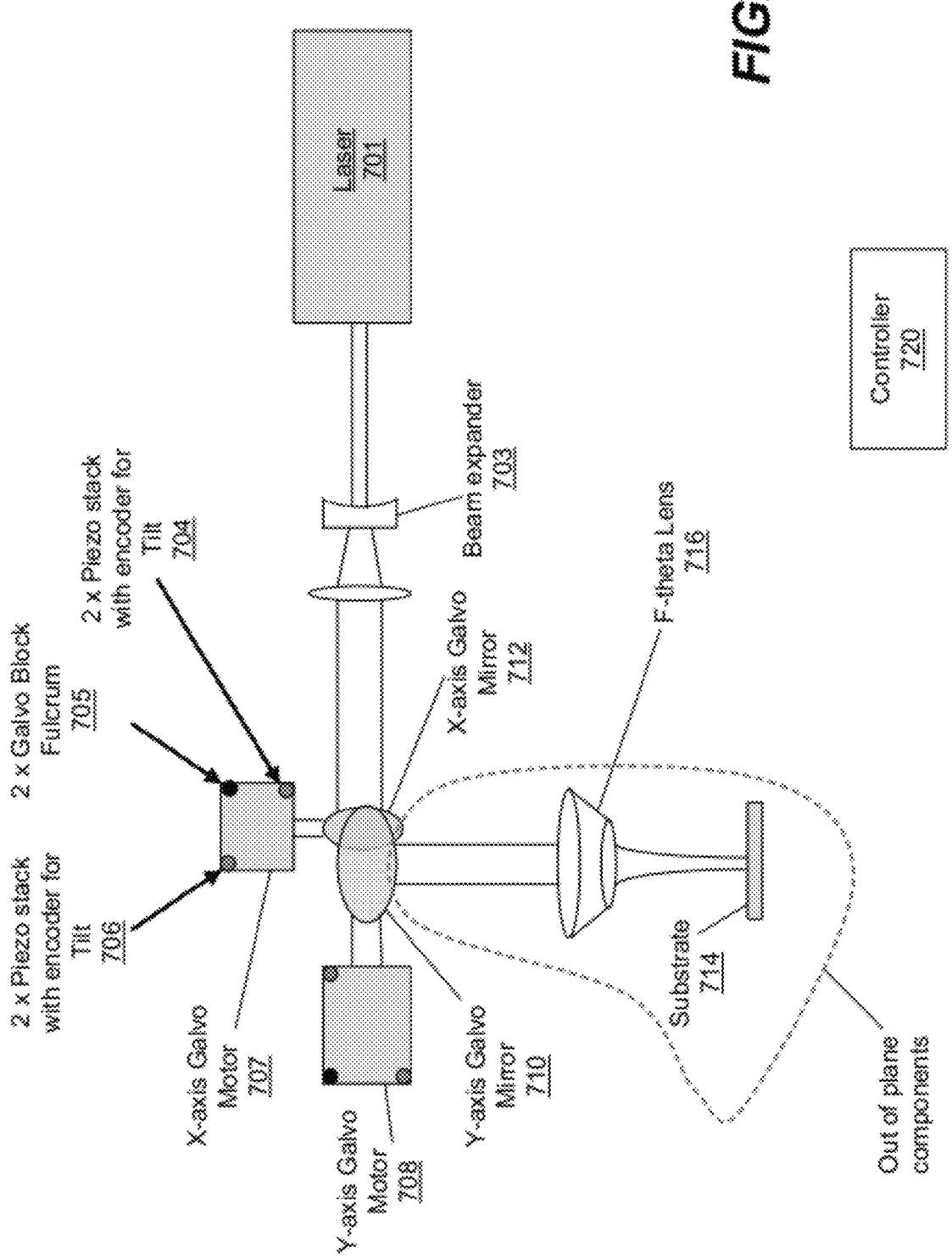
FIG. 7 is a schematic block diagram of components of a scanning and dithering system that may be used in accordance with various embodiments.

According to various embodiments, a galvo scanner is used to scan the laser along the scan line, and a much higher frequency piezo-controlled actuator is used to dither the beam within the scribe line. FIG. 7 shows a schematic block diagram of a system including a piezo-controlled actuator that may be used in accordance with embodiments described herein. The system includes laser 701 as well as X-axis galvo mirror 712 and motor 707 and Y-axis galvo mirror 710 and motor 708. X-axis galvo mirror 712 and Y-axis galvo mirror 710 direct the laser beam from laser 701 along and across a scribe line, respectively. Substrate 714 and F-theta lens 716 are depicted schematically; these components are out-of-plane of the sheet. In the depicted embodiment, X-axis galvo motor 707 is mounted to piezo-driven tip/tilt actuators 704 and 706 which are two piezo stacks with position encoders for tip/tilt motion. The piezo tip/tilt actuator imparts tip/tilt motion about X-axis galvo block fulcrums 705, providing high frequency motion to X-axis galvo mirror 712, while Y-axis galvo mirror 708 scans at a lower rate. (The implementation may also be reversed such that the X-axis high frequency motion is done with Y-axis galvo mirror 708, with X-axis galvo mirror 712 scanning at a lower rate.)

Laser 701, piezo stacks 706 and 704, and X-axis galvo motor 707 and Y-axis galvo motor 708 are connected to a controller 720 (connection not shown). Machine-readable media may be coupled to the controller and contain instructions for controlling the dither and scan as described above.

EXAMPLES

Figure 8A:
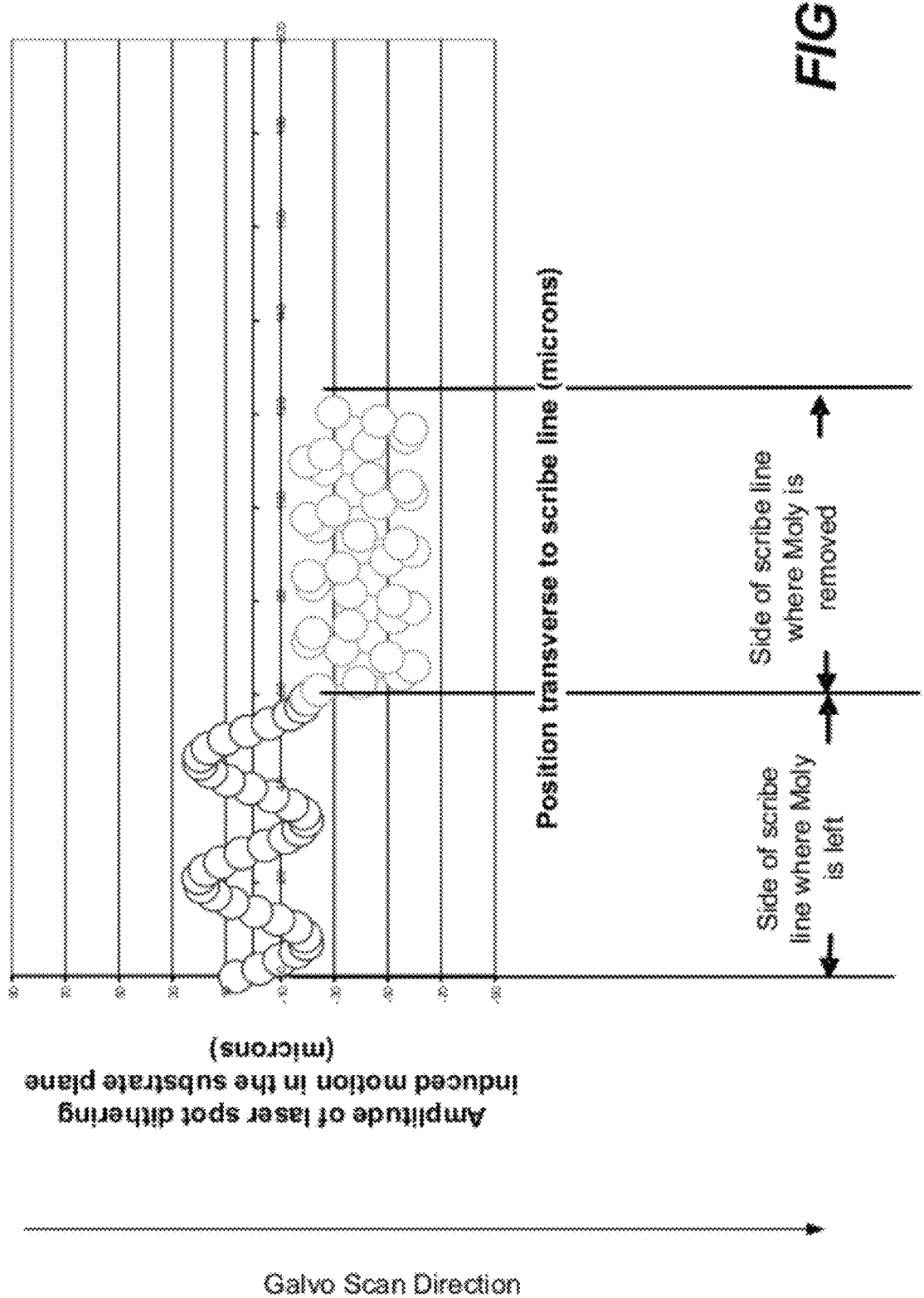
FIGS. 8A and 8B are schematic diagrams depicting a piezo-driven sinusoidal scanning motion of a laser beam.
Figure 8B:
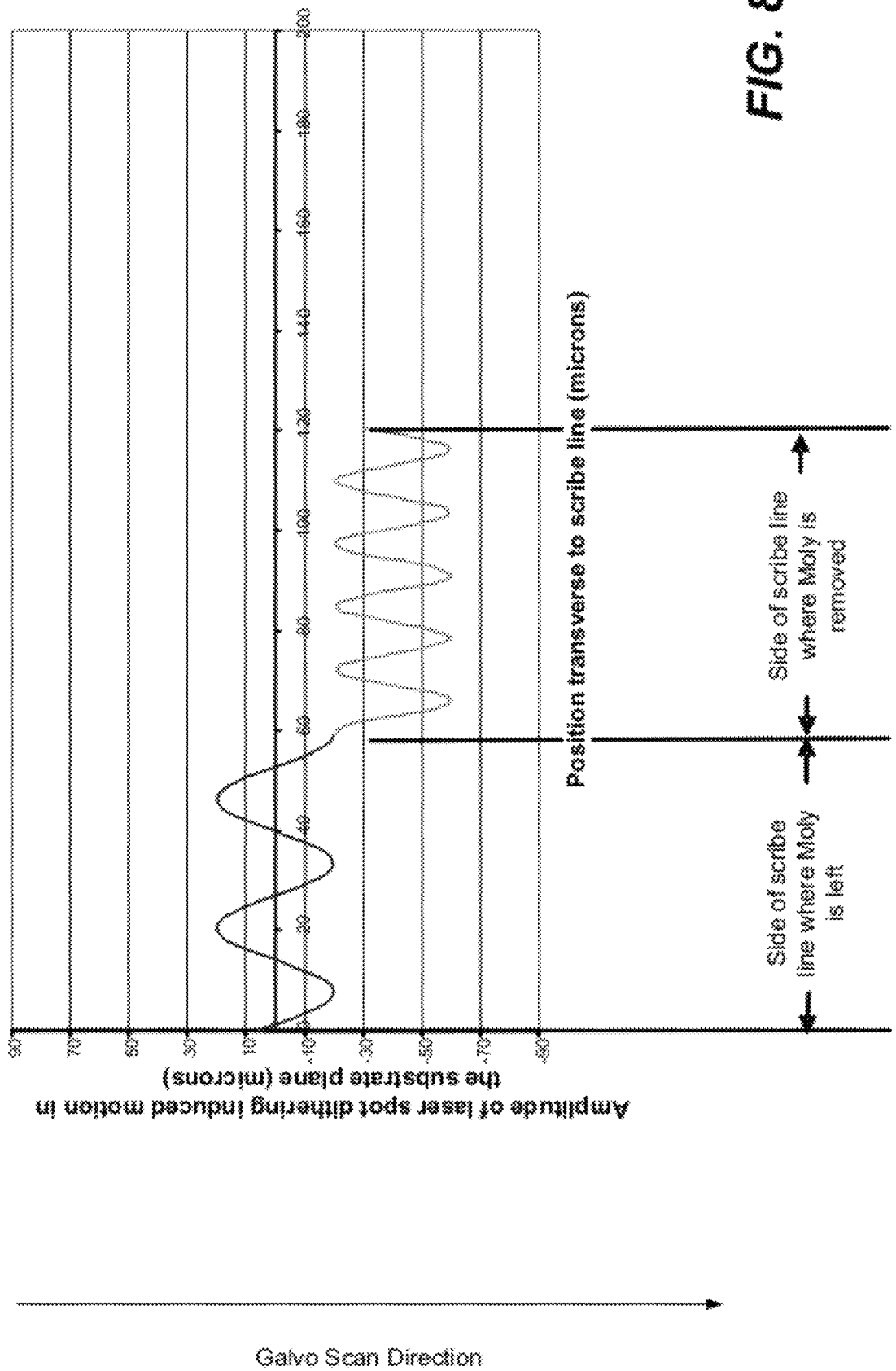
Figure 9:
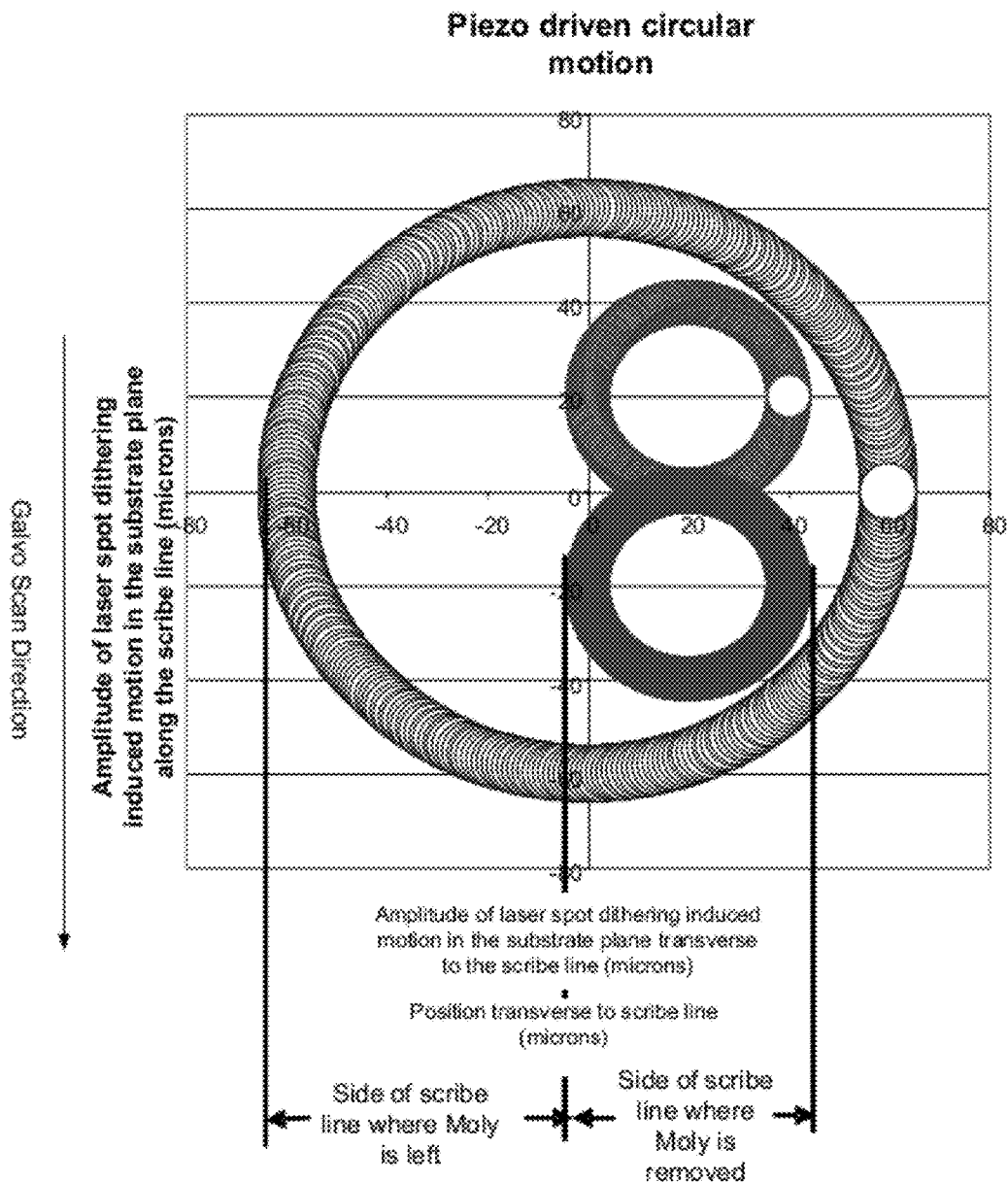
FIG. 9 is a schematic diagram depicting a piezo-driven circular scanning motion of a laser beam.

A combination of piezo actuator pairs acting as x and y are programmed to result in sinusoidal piezo-driven scanning motion with dither spatial frequency higher in one half of the scribe line where the scribe is go all the way though a Mo layer down to an insulating $SiO_2$ layer. This motion pattern is depicted schematically in FIGS. 8A and 8B, FIG. 8A showing the motion pattern with the beam spot, and FIG. 8B without the beam spot.

In another example, two piezo actuators acting as x and y coordinates are programmed to produce a piezo-driven circular scanning motion. This motion pattern is depicted schematically in FIG. 9. The large circle has a diameter equal to the diameter of the scribe line, and two smaller circles have a diameter roughly equal to half the scribe line width. The side of the multiple circles would be where the scribe is to go all the way through the Molybdenum layer down to the insulating SiO2 layer.

Although the foregoing invention has been described in some detail for purposes of clarity of understanding, it will be apparent that certain changes and modifications may be practiced within the scope of the invention. It should be noted that there are many alternative ways of implementing both the processes and apparatuses of the present invention. For example, while Gaussian pulsed laser beams are employed in many embodiments, non-Gaussian pulses and/or continuous beams may also be employed. Also in certain embodiments, the dithered scanned beam may be used to form stepped profiles other than the ones depicted in the figures, e.g., for other solar cell integration schemes. For example, the step may include other layers. Multi-step profiles may be created according to various embodiments. Accordingly, the present embodiments are to be considered as illustrative and not restrictive, and the invention is not to be limited to the details given herein.

What is claimed is:

1. A method of forming a monolithically integrated thin film photovoltaic cell, the method comprising:
   providing a substrate having thin film photovoltaic materials deposited thereon,
   identifying a scribe line across the substrate;
   scanning a dithered laser beam along the scribe line to form electrically unconnected photovoltaic cells on either side of the scribe line, wherein a scribed line profile formed by scanning the dithered laser beam is stepped.

2. The method of claim 1 wherein scanning the dithered laser beam across the substrate comprises ablating the thin film photovoltaic materials completely to leave an insulative layer exposed along a first portion of the scribe line; and ablating the thin film photovoltaic materials to leave a conductive thin film layer exposed along a second portion of the scribe line, wherein said first and second portions are substantially parallel with the scribe line.

3. The method of claim 2 wherein said first and second portions are substantially co-extensive with the scribe line.

4. The method of claim 1 wherein the photovoltaic cells each comprise a back electrical contact layer, an absorber layer and a top electrical contact layer.

5. The method of claim 3 wherein the stepped scribed line profile is defined by a substantially vertical first sidewall including the back electrical contact layer, the absorber layer and the top electrical contact layer; a bottom including an insulative layer; a step including the back contact layer; and a substantially vertical second sidewall extending from the back contact step and including the absorber layer and the top electrical contact layer.

6. The method of claim 4 wherein the back contact layer is selected from the group consisting of molybdenum, chromium, niobium, copper, titanium, and zirconium.

7. The method of claim 1 wherein the absorber layer is selected from the group consisting of CIGS, CIS, CZTS, CdTe, and a-Si.

8. The method of claim 1 further comprising varying at least one dither parameter across the width of the scribe line.

9. The method of claim 8 wherein the at least one dither parameter comprises frequency, direction or amplitude of a dither motion path.

10. The method of claim 1 further comprising varying at least one laser operating parameter across the width of the scribe line.

11. The method of claim 10 wherein the at least one laser operating parameter comprises a laser pulse repetition rate.

12. The method of claim 10 wherein the at least one laser operating parameter comprises a laser energy per pulse.

13. The method of claim 10 wherein the at least one laser operating parameter comprises a laser beam dwell time.

14. The method of claim 10 wherein the at least one laser operating parameter comprises a laser intensity.

15. The method of claim 1 further comprising forming a conductive path between the photovoltaic cells on either side of the scribe line.

16. The method of claim 1 wherein the length of the scribe line is at least 0.5 m.

17. The method of claim 1 wherein the stepped scribed line profile is formed in a single pass of the laser beam across the substrate.

18. The method of claim 1 wherein scanning a dithered laser beam comprises sensing laser beam position relative to the scribe line width.

19. The method of claim 1 wherein the laser beam is dithered via a piezo-actuated scanner.

20. The method of claim 19 wherein the laser beam is scanned via a galvo scanner.

* * * * *